United States Patent [19]

Imai et al.

[11] Patent Number: 4,572,889

[45] Date of Patent: Feb. 25, 1986

[54] LITHOGRAPHIC PRINTING PLATE AND PROCESS FOR PRODUCTION THEREOF

[75] Inventors: Masanori Imai; Hisao Kanzaki, both of Shizuoka, Japan

[73] Assignee: Fuji Photo Film Co., Ltd., Kanagawa, Japan

[21] Appl. No.: 684,408

[22] Filed: Dec. 20, 1984

[30] Foreign Application Priority Data

Dec. 26, 1983 [JP] Japan ................. 58-251819

[51] Int. Cl.$^4$ ............................................... G03F 7/08
[52] U.S. Cl. .................................. 430/302; 101/463.1; 430/328
[58] Field of Search ............... 430/302, 306, 309, 330, 430/331, 328, 151; 101/463.1, 456

[56] References Cited

U.S. PATENT DOCUMENTS

| | | | |
|---|---|---|---|
| 4,063,507 | 12/1977 | Toyama et al. | 430/151 |
| 4,191,570 | 3/1980 | Herting et al. | 430/302 |
| 4,355,096 | 10/1982 | Walls | 430/309 |

FOREIGN PATENT DOCUMENTS

| | | | |
|---|---|---|---|
| 0066437 | 4/1982 | Japan | 430/302 |
| 1330139 | 9/1973 | United Kingdom | 430/328 |

Primary Examiner—John E. Kittle
Assistant Examiner—Patrick J. Ryan
Attorney, Agent, or Firm—Sughrue, Mion, Zinn, Macpeak and Seas

[57] ABSTRACT

An improved lithographic printing plate and a process for production thereof, involving exposure to light, development, and burning-in treatment of a presensitized printing plate precursor, are disclosed, the improvement comprising applying an aqueous solution containing at least one compound selected from the group consisting of malic acid and salts thereof onto the printing plate precursor prior to the burning-in treatment; by the improvement, a lithographic printing plate having excellent printing durability can be produced.

31 Claims, No Drawings

LITHOGRAPHIC PRINTING PLATE AND PROCESS FOR PRODUCTION THEREOF

FIELD OF THE INVENTION

This invention relates to an improved process for producing a lithographic printing plate from a presensitized printing plate precursor, and more particularly, to an improvement in the process for producing a lithographic printing plate comprising imagewise exposing a presensitized printing plate precursor comprising a metal support to light, developing the precursor with a developer, and subjecting the precursor to burning-in treatment.

BACKGROUND OF THE INVENTION

Lithography is a printing system taking advantage of essential mutual repulsion between water and oil. Surfaces of lithographic printing plates comprise areas which accept water and repel a greasy ink and areas which repel water and accept a greasy ink, the former areas corresponding to non-image areas and the latter areas corresponding to image areas. Therefore, a light-sensitive composition which can be used in the production of lithographic printing plates is required to have a water repelling property and a greasy ink accepting property after image formation.

The light-sensitive compositions used for the production of lithographic printing plates are classified into positive working compositions and negative working compositions. The positive working light-sensitive compositions generally comprise o-quinonediazide compounds.

Positive working presensitized lithographic printing plate precursors comprise an appropriate support, such as a metal, a plastic, etc., generally having coated thereon an o-quinonediazide compound alone or a mixture of an o-quinonediazide compound and an alkali-soluble resin, such as a novolak including a phenol-formaldehyde resin, a cresol-formaldehyde resin, etc. When the printing plate precursor is exposed to actinic light through a positive transparency, the o-quinonediazide compound in the exposed areas is decomposed to form an alkali-soluble substance, which can be easily removed by an alkaline aqueous solution to produce a positive image. Therefore, if using a support having a hydrophilic surface, the hydrophilic surface of the support in the areas from which the o-quinonediazide compound has been removed by an alkaline aqueous solution is exposed and accepts water but repels a greasy ink. To the contrary, the non-exposed areas remain oleophilic and accepts a greasy ink.

On the other hand, negative working light-sensitive compositions generally employ diazonium salts, azide compounds, or photopolymerizable compounds. Such compounds are coated on a support individually or in combination with appropriate additives such as resins. When a support having a hydrophilic surface is used, the non-exposed areas are removed with a developing solution to expose the hydrophilic surface of the support. The thus exposed areas accept water and repel an ink. To the contrary, the areas which have been cured upon exposure to light remain oleophilic and accept an ink.

When the thus produced lithographic printing plates are mounted on an offset printer, high quality prints can be obtained therefrom. Lithographic printing plates produced from the above-described presensitized printing plate precursors can generally produce several tens of thousands clear prints per plate by properly selecting a support and a composition for a light-sensitive layer provided thereon. In particular, use of an aluminum sheet that has been subjected to graining and anodic oxidation as the support makes it possible to obtain about 100,000 high quality prints per plate.

However, there has been a demand for further increasing the number of prints produced per printing plate, i.e., press life. Such a demand can effectively be satisfied by a process in which a presensitized printing plate precursor comprising a metal support, e.g., aluminum, zinc, etc., is exposed to light and developed in a conventional manner, and thereafter, heated at a high temperature (a so-called burning-in treatment) to reinforce the image areas. By the burning-in treatment, the printing durability (or "press life") of lithographic printing plates can be increased several times.

Further, when printing is carried out using a special printing ink containing a large amount of a component that dissolves image areas on the printing plate, such as an ultraviolet-curing ink or a low temperature-drying ink, the printing plate produced by an ordinary process omitting a burning-in treatment suffers intense elution on the image areas, resulting in considerable deterioration of press life. On the other hand, a printing plate that has been subjected to burning-in treatment has a greatly improved solvent resistance of image areas and, therefore, can produce a satisfactory number of prints even with the above-described special printing inks.

However, the burning-in treatment tends to deteriorate the hydrophilic property of the non-image areas, i.e., the areas wherein the hydrophilic surface of the support is exposed by development, and renders the non-image areas receptive to printing ink, which leads to formation of stains on the background of prints. If the heating of the burning-in treatment is effected only to such an extent that it does not cause any such background stains, a burning effect sufficient to achieve the desired reinforcement of image areas cannot be attained. Therefore, in order to prevent formation of stains in non-image areas due to the burning-in treatment, a counter-etching treatment should always be carried out before and/or after the burning-in treatment.

Various counter-etching treatments have been proposed. For example, a processing solution which can be used after burning-in treatment for removing the scum in the non-image areas to restore the hydrophilic surface includes an aqueous solution of a fluoride, e.g., hydrofluoric acid, borofluoric acid, hydrosilicofluoric acid, and the like. These fluorides, however, are generally very poisonous substances, and give rise to many problems from the standpoint of environmental pollution.

Furthermore, the above-described counter-etching treatment with a fluoride aqueous solution corrodes a metal surface of the support. Since a corroded metal surface easily takes scratches and has poor abrasion resistance, the property of non-image areas to accept water (i.e., water retention property) is lost, causing background stains during printing, thereby reducing press life.

Further, a treatment for use before the burning-in treatment for preventing the scumming of non-image areas includes a treatment with an aqueous solution of a salt of an organic sulfonic acid, e.g., a sodium alkylnaphthalenesulfonate and a sodium alkyldiphenyl ether sulfonate, or lithium nitrate before burning-in treatment, as described in U.S. Pat. No. 4,294,910. Of these processing solutions, an aqueous solution of the organic sulfonate causes remarkable foaming and is, therefore, unsuitable for use in a commonly employed processing machine of spray circulatory system and also cannot be applied to automation of plate making. On the other hand, treatment with a solution containing lithium nitrate followed by burning-in treatment is not sufficient to prevent background stains. Furthermore, U.S. Pat. No. 4,063,507 discloses a method comprising treating a printing plate precursor with an aqueous solution containing sublimating boric acid and a salt thereof followed by burning-in treatment in the presence of these compounds, but this method is also insufficient in prevention of background stains. In particular, depending on conditions for washing with water, gumming, etc., subsequent to the burning-in treatment, i.e., if washing with water is insufficient or a desensitizing gum comprising a dextrin (which has a poor activity to provide a hydrophilic property) is used at a gumming step, scumming is apt to generate. Still further, Canadian Pat. No. 1,084,758 discloses a treatment before burning-in treatment with an aqueous solution of a water-soluble organic substance, e.g., gum arabic, cellulose ethers, polyacrylic acid, etc., and/or a water-soluble inorganic salt, e.g., nitrates, phosphates, sulfates, halides of alkali metals or alkaline earth metals, etc. However, this method is not only insufficient to achieve complete prevention of scumming but also disadvantageous in that image areas hardly accept printing ink (i.e., image-blinding) in carrying out printing, particularly when an aqueous solution of a water-soluble polymer, such as gum arabic, polyacrylic acid, etc., is used as a desensitizing gum. Moreover, U.S. Pat. No. 4,355,096 discloses a treatment before burning-in treatment with an aqueous solution containing an amine having a carboxyl group, e.g., ethylenediaminetetraacetic acid, a hydroxyalkylethylenediaminetriacetic acid, etc., or a salt thereof. This method is also insufficient in preventing scumming.

SUMMARY OF THE INVENTION

Accordingly, an object of this invention is to provide an improved lithographic printing plate and a process for production thereof including a burning-in treatment, and more particularly to provide a process for producing a lithographic printing plate including burning-in treatment, which is free from scumming and has highly oleophilic and ink-receptive image areas.

Another object of this invention is to provide a process for producing a lithographic printing plate including a burning-in treatment, which process can be automatically operated by utilizing a processing machine including a circulatory spray system.

It has now been found that the above-described objects can be accomplished by a process for producing a lithographic printing plate which comprises coating a presensitized printing plate precursor comprising a metal support with an aqueous solution containing at least one compound selected from the group consisting of malic acid and salts thereof after development but before the burning-in treatment.

DETAILED DESCRIPTION OF THE INVENTION

The above-described processing solution to be applied on a presensitized printing plate precursor prior to burning-in treatment will hereinafter be referred to as a "pre-burning processing solution".

Salts of malic acid which can be used in the present invention are preferably a sodium salt, a potassium salt, an ammonium salt, and the like.

The pre-burning processing solution according to the present invention comprises an aqueous solution containing one or more of malic acid and salts thereof over a wide range of concentration that is not particularly limited, and generally the amount can be from about 0.5% by weight to a "saturation amount" as a maximum, and preferably the concentration is from 2 to 25% by weight.

The pre-burning processing solution can further contain a wide variety of additives, such as surface active agents, various salts, acids, alkalis, and the like.

Surface active agents ensure uniform coating of the pre-burning processing solution on the surface of a lithographic printing plate precursor and, at the same time, partially suppress formation of stains in non-image areas. The surface active agents which are preferably used in the present invention are anionic surface active agents, and the particularly preferred are sulfo group-containing surface active agents, such as alkylbenzenesulfonates, alkyldiphenyl ether disulfonates, alkylnaphthalenesulfonates, condensates between alkylnaphthalenesulfonates and aldehydes, α-olefin sulfonates, and the like; and sulfuric ester type surface active agents, such as lauryl sulfate, polyoxyalkylene alkyl ether sulfates, polyoxyethylene alkylphenyl ether sulfates, and the like. These surface active agents are suitably used in an amount of from about 0.05 to about 20% by weight, and preferably from 0.1 to 10% by weight, based on the total weight of the pre-burning processing solution.

Salts which can be added to the pre-burning processing solution according to the present invention include various alkali metal salts and ammonium salts of organic or inorganic acids other than malic acid, e.g., sodium dihydrogenphosphate ($NaH_2PO_4$), disodium hydrogenphosphate ($Na_2HPO_4$), sodium tertiary phosphate ($Na_3PO_4$), dipotassium hydrogenphosphate ($K_2HPO_4$), potassium tertiary phosphate ($K_3PO_4$), sodium hexametaphosphate, potassium hexametaphosphate, ammonium hexametaphosphate, sodium nitrate, potassium nitrate, ammonium nitrate, sodium borate, ammonium borate, sodium citrate, sodium gluconate, sodium tartarate, potassium tartarate, sodium pyrrolidonecarboxylate, sodium sulfosalicylate, sodium succinate, sodium sulfate, ammonium sulfate, sodium phytate, potassium phytate, ammonium phytate, and the like. Of these salts, hexametaphosphates and phytates are particularly preferred. Incorporation of the above-recited salts in the pre-burning processing solution improves the hydrophilic property of aluminum oxide on the surface of an aluminum support and also assists in suppressing formation of stains due to the burning-in treatment.

The amount of the above-described salts to be added to the pre-burning processing solution ranges from about 1% by weight to a saturation amount, and preferably is from 1 to 10% by weight, based on the total weight of the processing solution.

The acids which can be used in the pre-burning processing solution according to the present invention include organic acids other than malic acid, such as acetic acid, oxalic acid, tartaric acid, citric acid, etc., and inorganic acids, such as phosphoric acid, nitric acid, boric acid, etc.

The alkalis which can also be used in the preburning processing solution preferably include sodium hydroxide, potassium hydroxide, and the like.

These acids and alkalis can be added to the pre-burning processing solution in amounts sufficient to adjust the pH value of the pre-burning processing solution to a range of preferably from 2 to 12, and more preferably from 3 to 10. Such pH-adjustment with acids or alkalis not only permits safe handling of the pre-burning processing solution, but also reduces etching property of the processing solution on an aluminum support, and, in addition, prevents deterioration of the hydrophilic property of an aluminum oxide surface of the support.

The pre-burning processing solution which can be used in the present invention may further contain a water-soluble high polymer (for example, gum arabic, dextrin, carboxymethyl cellulose, poly(meth)acrylic acid or salts thereof (e.g., sodium salt)), a dye, a defoaming agent, a preservative, etc.

After a presensitized lithographic printing plate precursor is imagewise exposed to light, developed, and, if desired, washed with water, any areas unnecessary for printing are removed with a correcting agent to thereby prepare a corrected printing plate precursor. The thus prepared printing plate precursor is then, or after being dried if desired, coated with the aforesaid processing solution prior to the burning-in treatment. The application of the processing solution can be carried out, for example, by spreading on the precursor with sponge or absorbent cotton having the processing solution absorbed therein, soaking the precursor in the processing solution, or application by the use of an automatic coater. After the application of the processing solution, the coverage is preferably made uniform with a squeegee or a squeezing roller.

The lithographic printing plate precursor having thus coated thereon the pre-burning processing solution is then, or after being dried if desired, subjected to heating at a high temperature by means of a burning processor, e.g., Burning Processor 1300, manufactured by Fuji Photo Film Co., Ltd. The heating is preferably carried out at a temperature ranging from 180° to 300° C. for a period of from 1 to 20 minutes, depending on the components constituting image areas.

The burned lithographic printing plate can be subjected to conventionally employed following-up treatments such as washing with water, gum coating, and the like.

The process for plate making in accordance with the present invention can be applied to various presensitized lithographic printing plate precursors, particularly to presensitized lithographic printing plate precursors comprising an aluminum support. Such presensitized lithographic printing plate precursors and the plates made therefrom preferably include those comprising an aluminum sheet having provided thereon a light-sensitive layer comprising a mixture consisting of a diazo resin (a salt of a condensate between p-diazodiphenylamine and p-formaldehyde) and shellac as described, e.g., in British Pat. No. 1,350,521; negative working presensitized printing plate precursors comprising an aluminum sheet having provided thereon a light-sensitive layer comprising a mixture consisting of a diazo resin and a homo- or copolymer having a hydroxyethyl methacrylate repeating unit as a sole monomer or a major comonomer, as described, e.g., in U.S. Pat. Nos. 4,123,276 and 4,275,139; and positive working presensitized printing plate precursors comprising an aluminum support having provided thereon a light-sensitive layer comprising a mixture consisting of an o-quinonediazide light-sensitive compound and a novolak phenol resin, as described, e.g., in U.S. Pat. Nos. 3,635,709 and 4,123,279. The process according to the present invention can also be applied to presensitized printing plate precursors including those comprising an aluminum sheet having coated thereon a light-sensitive layer composed of a photo-cross-linking photopolymer as described in U.S. Pat. No. 3,860,426; those comprising an aluminum sheet having provided thereon a light-sensitive layer composed of a photopolymerizable photopolymer composition as disclosed, e.g., in U.S. Pat. Nos. 4,072,528 and 4,072,527; and those comprising an aluminum sheet having provided thereon a light-sensitive layer comprising a mixture of an azide compound and a water-soluble polymer as disclosed in British Pat. Nos. 1,235,281 and 1,495,861. Of these presensitized printing plate precursors, the most preferred to which the process of the present invention is applicable are positive working presensitized printing plate precursors having a light-sensitive layer composed of an o-naphthoquinonediazide compound and a novolak resin. Details for such positive working presensitized printing plate precursors are described in U.S. Pat. No. 4,259,434, column 3, line 2 from the bottom to column 6, line 14.

According to the process of the present invention, the necessity of surface treatment after the burning-in treatment is eliminated. Nevertheless, no scum is formed in non-image areas, and lithographic printing plates having image areas of high receptivity to greasy inks and having excellent longer press life can be produced. Further, since the pre-burning processing solution used in the present invention has a low foaming property, it can be coated on a lithographic printing plate precursor by means of a processing machine of spray circulatory system, thus enabling automatic operation for the platemaking operation.

The present invention will now be illustrated in greater detail with reference to examples, but it should be understood that the present invention is not limited thereto. In these examples, all percents, parts and ratios are given by weight, unless otherwise indicated.

EXAMPLE 1

2 parts of a naphthoquinone-(1,2)-diazido(2)-5-sulfonic ester of 1,5-dihydroxynaphthalene and 4 parts of a novolak cresol-formaldehyde resin were dissolved in 100 parts of ethylene glycol monomethyl ether to prepare a light-sensitive composition.

A 0.24 mm thick aluminum sheet, after being subjected to brush graining, was coated with the above prepared composition to a dry thickness of 2.5 g/m$^2$. The thus obtained positive working presensitized lithographic printing plate precursor was brought into intimate contact with a positive transparency and exposed to light emitted from a 3 kw metal halide lamp from a distance of 1 m for 30 seconds. The printing plate precursor was then immersed in a 5% aqueous solution of sodium silicate for about 1 minute for development. After washing with water, a pre-burning processing solution of the following composition was coated on the printing plate precursor, followed by drying.

| Composition of Pre-Burning Processing Solution | |
|---|---|
| d,l-Malic Acid | 100 g |

-continued

| Composition of Pre-Burning Processing Solution | |
| --- | --- |
| Sodium Hydroxide | 50 g |
| Pure Water | 1,000 ml |

The thus treated printing plate precursor was heated at 260° C. for 6 minutes in a commercially available burning processor. After cooling, the printing plate precursor was coated with a commercially available desensitizing gum. The resulting lithographic printing plate was mounted on an offset press to carry out printing. As a result, beautiful prints could be obtained after several prints from the start of printing, and succesive printing produced 150,000 high quality prints.

COMPARATIVE EXAMPLE 1

A lithographic printing plate was produced in the same manner as described in Example 1 except that the pre-burning processing solution as used in Example 1 was replaced by a 4% aqueous solution of ammonium borate. When the resulting lithographic printing plate was mounted on a printing machine, stains were formed on dot images of shadow areas from the very start of printing and had to be removed by treatment of the plate with a plate cleaner.

EXAMPLE 2

A 0.3 mm thick aluminum sheet, after being subjected to graining and anodic oxidation (anodic oxidation was conducted in 15% sulfuric acid at a current density of 1.6 A/dm$^2$ for 2 minutes), was coated with the same light-sensitive composition as used in Example 1 to provide a dry coverage of 2.5 g/m$^2$, to thus prepare a positive working presensitized lithographic printing plate precursor. A transparent pattern was brought into intimate contact with the printing plate precursor, and the precursor was exposed to light emitted from a 3 kw metal halide lamp from a distance of 1 m for 40 seconds through the pattern, and then immersed in a 7% aqueous solution of sodium silicate for about 1 minute to effect development. The resulting lithographic printing plate precursor was continuously processed by an automatic burning processor manufactured by Process Shizai K.K., by which a series of processing steps including application of a pre-burning processing solution, burning-in treatment and gumming can be successively carried out. The conditions for burning were 150° C. for the former stage heating; 240° C. for the latter stage heating; and about 3 minutes more retention time in the furnace. The pre-burning processing solution had the following composition.

| Composition of Pre-Burning Processing Solution | |
| --- | --- |
| d,l-Malic acid | 150 g |
| Potassium Hydroxide | 90 g |
| 85% Phosphoric Acid | 10 g |
| Pure Water | 1,000 ml |

When the resulting lithographic printing plate was mounted on an offset printer, beautiful prints could be obtained after several prints from the start of printing, and the successive printing produced 300,000 clear prints.

COMPARATIVE EXAMPLE 2

The same procedures as described in Example 2 were repeated except for using an 8% aqueous solution of sodium dodecyldiphenyl ether sulfonate as a pre-burning processing solution in the burning processor. However, the processing solution in the spray pipe at the application part and the feeder significantly foamed and overflowed the feeder, so that the operation of the automatic processing machine had to be ceased.

EXAMPLE 3

The same procedures as described in Example 1 were repeated except for using an aqueous solution of the following composition as a pre-burning processing solution. When the resulting lithographic printing plate was mounted on a printing machine to carry out printing, the same results as obtained in Example 1 were obtained.

| Composition of Pre-Burning Processing Solution | |
| --- | --- |
| d,l-Malic Acid | 100 g |
| Potassium Hydroxide | 50 g |
| 85% Phosphoric Acid | 5 g |
| Sodium Isopropylnaphthalenesulfonate | 5 g |
| Pure Water | 1,000 ml |

EXAMPLE 4

4 parts of a naphthoquinone-1,2-diazido(2)-5-sulfonic acid ester of polyhydroxyphenyl obtained by polycondensation of acetone and pyrogallol as described in U.S. Pat. No. 3,635,709 and 4 parts of a novolak cresolformaldehyde resin were dissolved in 100 parts of ethylene glycol monomethyl ether, and the resulting coating composition was coated on an aluminum sheet as used in Example 2 so as to result in a dry coverage of 2.5 g/m$^2$, to thus prepare a positive working presensitized lithographic printing plate precursor.

The resulting printing plate precursor was subjected to light exposure, development and water washing under the same conditions as used in Example 1. Thereafter, the printing plate precursor was coated with a pre-burning processing solution having the following composition, followed by subjecting the precursor to burning-in treatment at 260° C. for 5 minutes.

| Composition of Pre-Burning Processing Solution | |
| --- | --- |
| d,l-Malic Acid | 200 g |
| Sodiuum Hydroxide | 100 g |
| Citric Acid | 10 g |
| Pure Water | 1,000 ml |

When the resulting lithographic printing plate was mounted on an offset printer without conducting gumming, beautiful prints could be obtained after several prints from the start of printing and the successive printing produced 200,000 high quality prints.

EXAMPLE 5

20 parts of shellac and 3 parts of a diazo resin obtained by condensing p-diazodiphenylamine p-toluenesulfonate with formaldehyde were dissolved in 80 parts of dimethylformamide to prepare a light-sensitive coating composition. An aluminum sheet, after being subjected to graining, was immersed in a 0.2% aqueous solution of potassium fluorozirconate at 80° C. for 3 minutes to passivate the surface. After washing with water followed by drying, the above prepared coating composition was applied to the aluminum sheet to provide a dry coverage of 2.0 g/m$^2$.

The resulting negative working presensitized lithographic printing plate precursor was exposed to light emitted from a 3 kw metal halide lamp from a distance of 1 m for 30 seconds through a negative transparency. The exposed printing plate precursor was immersed in a 20% aqueous solution of isopropyl alcohol for about 1 minute and then lightly rubbed on its surface with absorbent cotton to remove the unexposed areas, whereby the surface of the aluminum support in the unexposed areas was exposed. After washing with water, the same pre-burning processing solution as used in Example 1 was applied onto the printing plate precursor and dried. The precursor was then subjected to burning-in treatment under the same conditions as in Example 1, and, thereafter, mounted on an offset printer to carry out printing. As a result, high quality prints were obtained after more than ten prints from the start of printing, and the successive printing produced 150,000 prints undergoing substantially no change in tone.

EXAMPLE 6

An aluminum sheet was grained with a pumice/water slurry and a nylon brush and anodized in 20% sulfuric acid at a current density of 2 A/dm² for 2 minutes. Then, the aluminum sheet was treated with a 2.5% aqueous solution of sodium silicate at 70° C. for 1 minute to produce a 0.3 mm thick aluminum support.

Onto the aluminum support was applied a light-sensitive coating composition having the following composition, to provide a dry coverage of 2.0 g/m².

| Composition of Light-Sensitive Coating Composition | |
| --- | --- |
| 2-Hydroxyethyl Methacrylate/Acrylonitrile/Ethyl Methacrylate/Methacrylic Acid Copolymer (37/34/22/7 by weight) | 5.0 g |
| Diazo Resin Obtained by Condensing p-Diazodiphenylamine p-Toluenesulfonate with Formaldehyde | 0.5 g |
| Victoria Pure Blue BOH, a Trademark for Dye Product of Hodogaya Chemical Co., Ltd. | 0.1 g |
| Methyl Cellosolve | 95 ml |
| Water | 5 ml |

The thus obtained negative working presensitized lithographic printing plate precursor was exposed to light through a negative transparency using a 3 kw metal halide lamp from a distance of 1 m for 30 seconds, and developed with a developing solution having the following composition.

| Composition of Developing Solution | |
| --- | --- |
| Benzyl Alcohol | 30 ml |
| Diethanolamine | 10 g |
| Sodium Sulfite | 5 g |
| Sodium Isopropylnaphthalenesulfonate | 10 g |
| Water | 1,000 ml |

After washing with water, the printing plate precursor was coated with the same pre-burning processing solution as used in Example 2, dried, and subjected to burning-in treatment under the same conditions as in Example 2. When the resulting printing plate was placed on an offset printer, high quality prints could be obtained after several prints from the start of printing, and the successive printing produced 200,000 prints having substantially equal tone.

EXAMPLE 7

A light-sensitive coating composition having the following composition was applied onto an aluminum sheet that had been subjected to graining, anodic oxidation, and treatment with sodium silicate as in Example 6, to provide a dry coverage of 3.0 g/m², followed by drying at 100° C. for 2 minutes.

| Composition of Light-Sensitive Coating Composition | |
| --- | --- |
| Methyl Methacrylate/Methacrylic Acid Copolymer (molar ratio = 85:15; intrinsic viscosity in an MEK solution at 30° C. = 0.166) | 56 g |
| Trimethylpropane Triacrylate | 40 g |
| 3-Methyl-2-benzoylmethylnaphtho-(1,2-d)thiazole | 5 g |
| Phthalocyanine Blue | 3 g |
| Ethylene Dichloride | 500 g |
| 2-Methoxyethyl Acetate | 500 g |

After drying, a 3% aqueous solution of polyvinyl alcohol was coated on the above obtained light-sensitive layer, to provide a dry coverage of 1.5 g/m², followed by drying.

The resulting printing plate precursor was exposed to light, developed and washed with water in the same manner as in Example 6. The printing plate precursor was coated with the same pre-burning processing solution as used in Example 4 and then subjected to burning-in treatment under the same conditions as in Example 4. When the resulting printing plate was placed on an offset printer, high quality prints were obtained after several prints from the start of printing.

EXAMPLE 8

The same procedures as described in Example 1 were repeated except that a pre-burning processing solution having the following composition was used in the burning processor and the resulting plate was gummed, followed by standing at 35° C. and 85% RH overnight.

| Composition of Pre-Burning Processing Solution | |
| --- | --- |
| Sodium d,l-Malate | 100 g |
| Sodium Phytate | 7 g |
| Sodium Hexametaphosphate | 10 g |
| Pure Water | 1,000 ml |

When the resulting lithographic printing plate was mounted on an offset printer, to carry out printing, high quality prints were obtained after several prints from the start of printing, and the successive printing produced 150,000 high quality prints.

EXAMPLE 9

The same procedures as described in Example 4 were repeated except for using a pre-burning processing solution having the following composition.

| Composition of Pre-Burning Processing Solution | |
| --- | --- |
| Sodium d,l-Malate | 200 g |
| Sodium Phytate | 20 g |
| Citric Acid | 10 g |
| Pure Water | 1,000 ml |

When the resulting lithographic printing plate was mounted on an offset printer to effect printing, high quality prints were obtained after several prints from the start of printing, and the successive printing produced 200,000 high quality prints.

While the invention has been described in detail and with reference to specific embodiments thereof, it will be apparent to one skilled in the art that various changes and modifications can be made therein without departing from the spirit and scope thereof.

What is claimed is:

1. In a process for producing a lithographic printing plate comprising imagewise exposing a presensitized lithographic printing plate precursor comprising a metal support to light, developing the precursor with a developing solution, and subjecting the developed printing plate precursor to a burning-in treatment, the improvement comprising applying an aqueous solution containing at least one compound selected from the group consisting of malic acid and salts thereof onto the printing plate precursor after development but before the burning-in treatment.

2. A process as in claim 1, wherein the malic acid salts are selected from the group consisting of a sodium salt, a potassium salt, and an ammonium salt.

3. A process as in claim 1, wherein said malic acid and salts thereof are present in an amount of from about 0.5% by weight to a saturation amount based on the total weight of the aqueous solution.

4. A process as in claim 3, wherein said malic acid and salts thereof are present in an amount of from 2 to 25% by weight based on the total weight of the aqueous solution.

5. A process as in claim 1, wherein the aqueous solution further contains at least one of a surface active agent, a salt other than a malate, an acid other than malic acid, and an alkali.

6. A process as in claim 5, wherein the aqueous solution contains a surface active agent selected from the group consisting of an alkylbenzenesulfonate, an alkyldiphenyl ether disulfonate, an alkylnaphthalenesulfonate, a condensate of an alkylnaphthalenesulfonate and an aldehyde, an α-olefin sulfonate, lauryl sulfate, a polyoxyethylene alkyl ether sulfate, and a polyoxyethylene alkylphenyl ether sulfate.

7. A process as in claim 5, wherein the aqueous solution contains a surface active agent in an amount of from about 0.05 to about 20% by weight based on the total weight of the aqueous solution.

8. A process as in claim 7, wherein the aqueous solution contains the surface active agent in an amount of from 0.1 to 10% by weight based on the total weight of the aqueous solution.

9. A process as in claim 5, wherein the aqueous solution contains a salt selected from the group consisting of sodium dihydrogenphosphate, disodium hydrogenphosphate, sodium tertiary phosphate, dipotassium hydrogenphosphate, potassium tertiary phosphate, sodium hexametaphosphate, potassium hexametaphosphate, ammonium hexametaphosphate, sodium nitrate, potassium nitrate, ammonium nitrate, sodium borate, ammonium borate, sodium citrate, sodium gluconate, sodium tartarate, potassium tartarate, sodium pyrrolidonecarboxylate, sodium sulfosalicylate, sodium succinate, sodium sulfate, ammonium sulfate, sodium phytate, potassium phytate, and ammonium phytate.

10. A process as in claim 9, wherein the salt is a hexametaphosphate or a phytate.

11. A process as in claim 5, wherein the salt is present in an amount of from about 1% by weight to a saturation amount based on the total weight of the aqueous solution.

12. A process as in claim 5, wherein the aqueous solution contains an acid selected from the group consisting of phosphoric acid, nitric acid, boric acid, acetic acid, tartaric acid, oxalic acid, and citric acid.

13. A process as in claim 5, wherein the aqueous solution contains an alkali selected from the group consisting of sodium hydroxide and potassium hydroxide.

14. A process as in claim 5, wherein the aqueous solution contains acid or alkali in an amount sufficient to adjust the aqueous solution to a pH of from 2 to 12.

15. A process as in claim 14, wherein the aqueous solution contains acid or alkali in an amount sufficient to adjust the aqueous solution to a pH of from 3 to 10.

16. A lithographic printing plate produced by a process comprising imagewise exposing a presensitized lithographic printing plate precursor comprising a metal support to light, developing the precursor with a developing solution, and subjecting the developed printing plate precursor to a burning-in treatment, wherein the improvement comprises applying an aqueous solution containing at least one compound selected from the group consisting of malic acid and salts thereof onto the printing plate precursor after the development but before the burning-in treatment.

17. A lithographic printing plate as in claim 16, wherein the malic acid salts are selected from the group consisting of a sodium salt, a potassium salt, and an ammonium salt.

18. A lithographic printing plate as in claim 16, wherein said malic acid and salts thereof are present in an amount of from about 0.5% by weight to a saturation amount based on the total weight of the aqueous solution.

19. A lithographic printing plate as in claim 18, wherein said malic acid and salts thereof are present in an amount of from 2 to 25% by weight based on the total weight of the aqueous solution.

20. A lithographic printing plate as in claim 16, wherein the aqueous solution further contains at least one of a surface active agent, a salt other than a malate, an acid other than malic acid, and an alkali.

21. A lithographic printing plate as in claim 20, wherein the aqueous solution contains a surface active agent selected from the group consisting of an alkylbenzenesulfonate, an alkyldiphenyl ether disulfonate, an alkylnaphthalenesulfonate, a condensate of an alkylnaphthalenesulfonate and an aldehyde, an α-olefin sulfonate, lauryl sulfate, a polyoxyethylene alkyl ether sulfate, and a polyoxyethylene alkylphenyl ether sulfate.

22. A lithographic printing plate as in claim 20, wherein the aqueous solution contains a surface active agent in an amount of from about 0.05 to about 20% by weight based on the total weight of the aqueous solution.

23. A lithographic printing plate as in claim 22, wherein the aqueous solution contains the surface active agent in an amount of from 0.1 to 10% by weight based on the total weight of the aqueous solution.

24. A lithographic printing plate as in claim 20, wherein the aqueous solution contains a salt selected from the group consisting of sodium dihydrogenphosphate, disodium hydrogenphosphate, sodium tertiary phosphate, dipotassium hydrogenphosphate, potassium tertiary phosphate, sodium hexametaphosphate, potassium hexametaphosphate, ammonium hexametaphosphate, sodium nitrate, potassium nitrate, ammonium nitrate, sodium borate, ammonium borate, sodium citrate, sodium gluconate, sodium tartarate, potassium tartarate, sodium pyrrolidonecarboxylate, sodium sulfosalicylate, sodium succinate, sodium sulfate, ammonium sulfate, sodium phytate, potassium phytate, and ammonium phytate.

25. A lithographic printing plate as in claim 24, wherein the salt is a hexametaphosphate or a phytate.

26. A lithographic printing plate as in claim 20, wherein the salt is present in an amount of from about 1% by weight to a saturation amount based on the total weight of the aqueous solution.

27. A lithographic printing plate as in claim 20, wherein the aqueous solution contains an acid selected from the group consisting of phosphiric acid, nitric acid, boric acid, acetic acid, tartaric acid, oxalic acid, and citric acid.

28. A lithographic printing plate as in claim 20, wherein the aqueous solution contains an alkali selected from the group consisting of sodium hydroxide and potassium hydroxide.

29. A lithographic printing plate as in claim 20, wherein the aqueous solution contains acid or alkali in an amount sufficient to adjust the aqueous solution to a pH of from 2 to 12.

30. A lithographic printing plate as in claim 29, wherein the aqueous solution contains acid or alkali in an amount sufficient to adjust the aqueous solution to a pH of from 3 to 10.

31. A lithographic printing plate as in claim 16, wherein the presensitized lithographic printing plate precursor is a positive working presensitized printing plate precursor having a light-sensitive layer composed of an o-naphthoquinonediazide compound and a novolak resin.

* * * * *